United States Patent [19]

Uematsu

[11] 4,176,367
[45] Nov. 27, 1979

[54] SEMICONDUCTOR OPTICAL DEVICE
[75] Inventor: Yutaka Uematsu, Yokosuka, Japan
[73] Assignee: Tokyo Shibaura Electric Co., Ltd., Kawasaki, Japan
[21] Appl. No.: 885,128
[22] Filed: Mar. 10, 1978
[30] Foreign Application Priority Data Mar. 24, 1977 [JP] Japan .................................. 52-31034

[51] Int. Cl.² ...................... H01L 31/12; H01L 33/00
[52] U.S. Cl. ......................................... 357/19; 357/17; 357/16; 357/18
[58] Field of Search ........................ 357/19, 17, 18, 30, 357/16

[56] References Cited

U.S. PATENT DOCUMENTS

| 3,936,855 | 2/1976 | Goell ........................................ 357/17 |
| 3,979,587 | 9/1976 | de Armoux ........................ 250/211 J |

OTHER PUBLICATIONS

Burrus, Proceed. of the IEEE, Feb. 1972, p. 231.

*Primary Examiner*—Martin H. Edlow
*Attorney, Agent, or Firm*—Oblon, Fisher, Spivak, McClelland & Maier

[57] ABSTRACT

A semiconductor optical device includes a semiconductor body, a light emitting layer formed on the body to form a pn junction therebetween, a semiconductor layer formed on the light emitting layer and a diffusing region formed in the semiconductor layer to define a pn junction therebetween and electrically connected to the light emitting layer. Three electrodes are respectively provided on the semiconductor body, semiconductor layer and diffusing region, which are selectively operated.

6 Claims, 2 Drawing Figures

SEMICONDUCTOR OPTICAL DEVICE

BACKGROUND OF THE INVENTION

This invention relates to a semiconductor device for use mainly in an optical communication field and in particular to a semiconductor optical device.

It is known in an optical communication technique to connect an optical fiber between a transmitter and a receiver for communication. A light emitting element is used as the transmitter and a light detecting element as the receiver. For a communication to be effected between the transmitter and the receiver both the light emitting element and light detection element are required both at the transmitter side and at the receiver side. A semiconductor device as shown, for example, in FIG. 1 can be used as such light emitting and detecting elements. In actual practice, however, such a device has encountered inconveniences in its use as both a light emitting element and a light detecting element. Furthermore, it would be impossible to reduce the number of parts required. Such a semiconductor device is called "Burrus" type light emitting element and manufactured as follows:

An n-conductivity type $Ga_{0.7}Al_{0.3}As$ layer 2, p-conductivity type GaAs layer 3, p-conductivity type $Ga_{0.7}Al_{0.3}As$ layer 4 and p-conductivity type GaAs layer 5 are formed by a liquid phase growth method on one surface of an n-conductivity type GaAs substrate 1 so as to be superposed in that order as shown in FIG. 1. An $SiO_2$ film 6 is formed on the GaAs layer 5 and its central portion is opened to permit a corresponding surface portion of the GaAs layer 5 to be exposed. An electrode 7 is formed on the $SiO_2$ film 6 in a manner to fill up the opening of the $SiO_2$ layer 6 for electrical connection to the GaAs layer 5. An opening is formed in the central area of the other surface of the substrate 1 and one end of an optical fiber 8 extends into the opening of the substrate 1. An electrode 9 is formed on the other surface of the substrate 1.

When a voltage is applied between the electrodes 7 and 9, a light is emitted from a region 3a in the p-conductivity type layer 3 (an activated layer), which is located above the opening of the insulating layer 6. The emitted light enters into the optical fiber 8 through the opening of the substrate 1. In this way, the device functions as a light emitting device. When, on the other hand, a light is sent through the optical fiber 8 toward the device, it reaches a pn junction between the layers 2 and 3 to develop a photoelectromotive force at the pn junction. If a resistor is connected between both electrodes 7 and 9, then an output corresponding to an amount of incident light can be taken off. As evident from this explanation the device uses the same potential when it is used as both the light emitter and light detector. For the device to be used as both the light emitter and light detector, it is necessary at the external circuit of the device to effect insertion of a resistor as well as separation of a light emission operation circuit. In consequence, a bulkier and complicated device results.

SUMMARY OF THE INVENTION

It is accordingly an object of this invention to provide a semiconductor optical device which can obviate the necessity of effecting insertion of a resistor as well as separation of a light emission operation circuit even when it works as both a light emitter and light detector and which involves no accompanying bulkiness and complication.

BRIEF DESCRIPTION OF THE DRAWINGS

This invention will be further explained by way of example with reference to the accompanying drawings, in which.

DETAILED DESCRIPTION OF THE PREFERRED EMBODIMENTS

A semiconductor optical device of this invention will now be explained by referring to the accompanying drawing.

Figure 1:
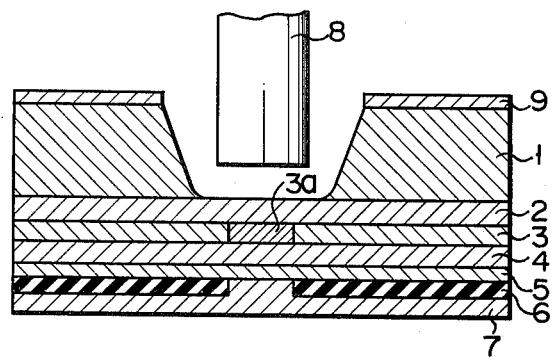
FIG. 1 is a cross-sectional view showing a conventional semiconductor optical device.
Figure 2:
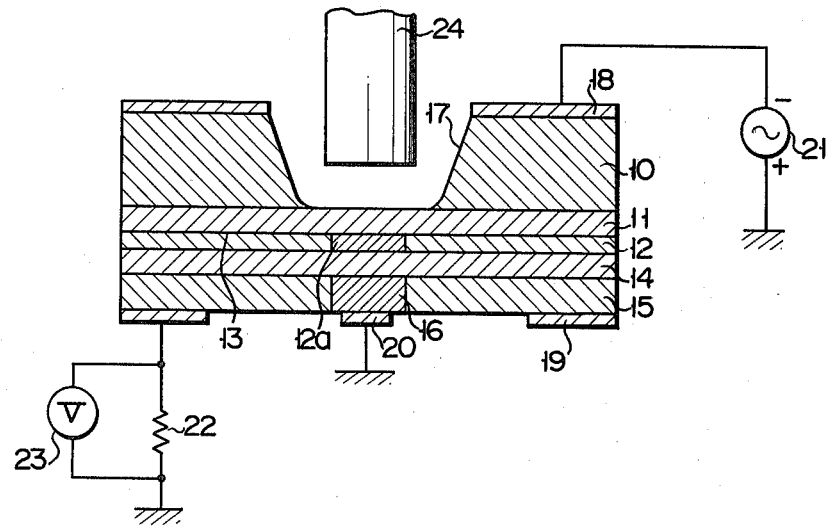
FIG. 2 is a cross-sectional view showing a semiconductor device according to one embodiment of this invention.

In FIG. 2 a reference numeral 10 shows an n-conductivity type GaAs substrate on one surface of which an n-conductivity type $Ga_{0.7}Al_{0.3}As$ layer 11 is formed. A p-conductivity type GaAs layer 12 is formed on the n-conductivity type layer 11 to provide a pn junction 13 therebetween. The GaAs layer 12 is relatively thin, for example, of the order of 1 $\mu m$ in thickness. A p-conductivity type $Ga_{0.7}Al_{0.3}As$ layer 14 is formed on the GaAs layer 12 and an n-conductivity type GaAs layer 15 on the layer 14. The layer 15 is relatively thick, for example, of the order of about $3\mu$ in thickness. Each of these layers may be formed in any method. In this embodiment, these layers are formed by a liquid phase epitaxial method. Zinc is diffused into the central area of the layer 15 so as to reach the layer 15 to form a p-conductivity type region 16 which is electrically connected to the $Ga_{0.7}Al_{0.3}As$ layer 14. The region 16 is in the form of a disk having a diameter of, for example, about $30\mu$.

An opening 17 is formed by a known selection etching method in the other surface of the substrate 10 in a manner to be in opposition to the region 16 of the layer 14. A ring-like or first electrode 18 is formed on the other surface of the substrate 10 and ring-like or second electrode 19 on the GaAs layer 15. A third electrode 20 for light detection and light emission is formed on the p-conductivity type region 16. The first electrode 18 is connected to a known signal source 21 and the second electrode 19 is grounded through a resistor 22. A voltameter 23 is connected in parallel with the resistor 22. The third electrode 20 is grounded. A reference numeral 24 shows a light emitting/receiving optical fiber, the forward end of which extends into the opening 17 of the substrate 10.

Suppose that the above-mentioned semiconductor optical device is used as a light emitting. In this case, a current signal from the signal source 21 is applied between the first and third electrodes 18 and 20 to cause a light to be emitted from that light emission section 12a in the p-conductivity type GaAs layer 12 which is located in opposition to the electrode 20. The light leads to the opening 17 through the n-conductivity type $Ga_{0.7}Al_{0.3}As$ layer 11 and received by the optical fiber 24.

Where the semiconductor optical device is used as a light detector, a light is emitted through the optical fiber 24 toward the light detector. That is, the light is incident onto the GaAs layer 12 through the $Ga_{0.7}Al_{0.3}As$ layer 11. Since the GaAs layer 12 is made relatively thin to shorten the build-up of the light and thus permit a high speed modulation, the incident light travels through the layers 11 and 12 up to the region 16. During travel, the light is not absorbed by the layer 12 in any great amount and reaches to the pn junction between the layer 15 and the region 16 where a photoelectromotive force is developed. In consequence, a potential difference is developed between the second and third electrodes 19 and 20. The voltage is supplied, as a light signal, through the resistor 22 to the voltameter 23 where it is measured. The resistor 22 is not necessarily required. If use is made of a resistor greater than a series resistor between the first and second electrodes 18 and 19, a current for light emission hardly flows through the second electrode 19.

Although a multi-layer structure comprising a combination of GaAs and GaAlAs layers has been explained in connection with the above-mentioned embodiment, this invention is not necessarily restricted thereto. This invention can also be put to practice even if the other III-V Group Compounds, for example, are used. Even if the substrate and each layer are opposite in their conductivity type to those shown in FIG. 2, the same result can also be obtained. The region 16 in the layer 15 is formed not only by zinc diffusion, but also by diffusion of another impurity well known in the art. The shape of the region 16 is not necessarily restricted to the circular cross-section.

What is claimed is:

1. A semiconductor optical device comprising a one-conductivity type semiconductor body through a portion of which light passes; a first semiconductor layer of the other conductivity type formed on one surface of the body to provide a pn junction therebetween and having a light emission section; a second semiconductor layer of said one conductivity type formed on said first semiconductor layer; a region formed in said second semiconductor layer to form a pn junction therebetween and having one end electrically connected to said first semiconductor layer and the other end exposed, said pn junction having a photoelectric conversion function; a first electrode formed on said body to permit a signal entry; a second electrode formed on said second semiconductor layer to permit the signal to be taken therefrom; and a third electrode formed on said region, said portion of the semiconductor body, light emission section and region being arranged on the same line.

2. A semiconductor optical device according to claim 1, further including a glass fiber for guiding a light to said first semiconductor layer, means for supplying a current signal to said first electrode, and means for taking a voltage signal from said second electrode.

3. A semiconductor optical device according to claim 2, in which said body has an opening in the other surface, in which the end of said glass fiber is located.

4. A semiconductor optical device according to claim 1, in which said body has a GaAs substrate and a GaAlAs liquid phase growth layer formed on the substrate, said first semiconductor layer has a GaAs liquid phase growth layer formed on the GaAlAs liquid phase growth layer and a GaAlAs liquid phase growth layer formed on said GaAs liquid phase growth layer, and said second semiconductor layer has a GaAs liquid phase growth layer.

5. A semiconductor optical device according to claim 4, in which said substrate has an opening to permit a portion of the GaAlAs liquid phase growth layer of the body to be exposed, and said region is formed in said second semiconductor layer in a manner to be located in opposition to said opening.

6. A semiconductor optical device according to claim 5, in which said first electrode is formed around said opening and has a ring-like shape, and said second electrode is located in opposition to said first electrode and has a ring-like shape.

* * * * *

UNITED STATES PATENT AND TRADEMARK OFFICE
CERTIFICATE OF CORRECTION

PATENT NO. : 4,176,367
DATED : Nov. 27, 1979
INVENTOR(S) : YUTAKA UEMATSU

It is certified that error appears in the above-identified patent and that said Letters Patent are hereby corrected as shown below:

Please insert the following priority information:

[30]  Mar. 23, 1977   [JP]   Japan.........52-31034

Signed and Sealed this

Tenth Day of June 1980

[SEAL]

*Attest:*

SIDNEY A. DIAMOND

*Attesting Officer*   *Commissioner of Patents and Trademarks*